(12) United States Patent
Soto

(10) Patent No.: US 7,450,689 B2
(45) Date of Patent: Nov. 11, 2008

(54) X-RAY APPARATUS

(75) Inventor: Jose Emilio Soto, Paris (FR)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/867,357

(22) Filed: Oct. 4, 2007

(65) Prior Publication Data

US 2008/0089482 A1 Apr. 17, 2008

(30) Foreign Application Priority Data

Oct. 16, 2006 (FR) .................................. 06 54295

(51) Int. Cl.
*H05G 1/10* (2006.01)
(52) U.S. Cl. ...................... 378/101; 378/114; 378/115
(58) Field of Classification Search .......... 378/101–118
See application file for complete search history.

(56) References Cited

U.S. PATENT DOCUMENTS

| | | | |
|---|---|---|---|
| 3,510,687 A | 5/1970 | Toutemonde | |
| 3,772,532 A | 11/1973 | Petrov et al. | |
| 4,394,590 A | 7/1983 | Honda | |
| 5,056,125 A | 10/1991 | Beland | 378/101 |
| 5,241,260 A | 8/1993 | Beland | |
| 6,275,391 B1 | 8/2001 | Laskai et al. | 700/103 |
| 6,344,701 B1 | 2/2002 | Kawamura et al. | 307/105 |

FOREIGN PATENT DOCUMENTS

| | | |
|---|---|---|
| FR | 1 463 915 A | 7/1966 |
| FR | 1 521 349 A | 4/1968 |
| FR | 2 077 002 A | 10/1971 |
| GB | 1 551 206 A | 8/1979 |

*Primary Examiner*—Courtney Thomas
(74) *Attorney, Agent, or Firm*—Global Patent Operation

(57) ABSTRACT

An X-ray apparatus comprises a general switch designed to eliminate the residual energy stored in capacitances of this X-ray apparatus. To this end, the general switch comprises several series-connected switch cells, each comprising a switch component constituted by a sidac parallel-connected with a thyristor. The number of cells is determined as a function of the voltage to be discharged. The apparatus has an external control circuit used to trigger the discharging of the first cell. Once the voltage in the first cell drops, the discharging of the second cell is triggered by an internal control circuit, and so on and so forth. The remaining cells are triggered at the same time, once they support a voltage greater than or equal to a predefined transition voltage. Thus, a chain reaction of the discharging of the stored energy is implemented.

15 Claims, 3 Drawing Sheets

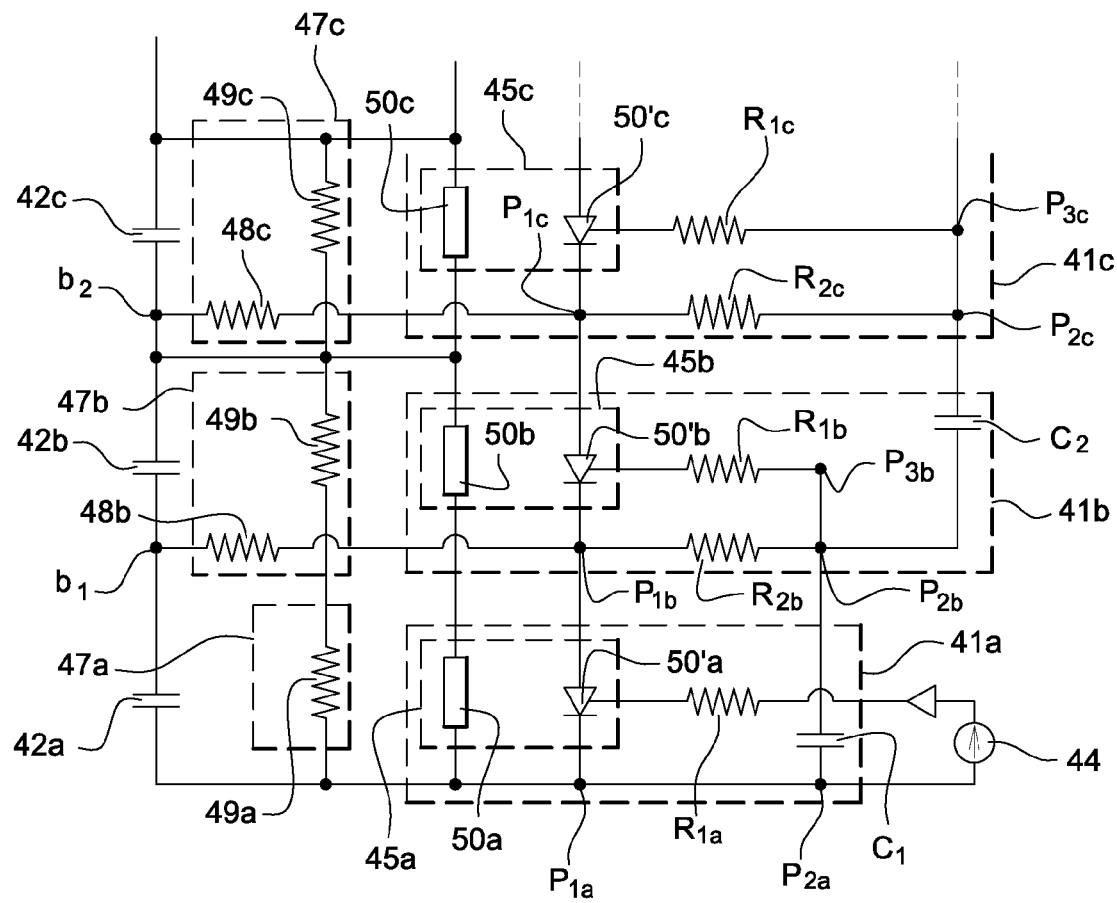
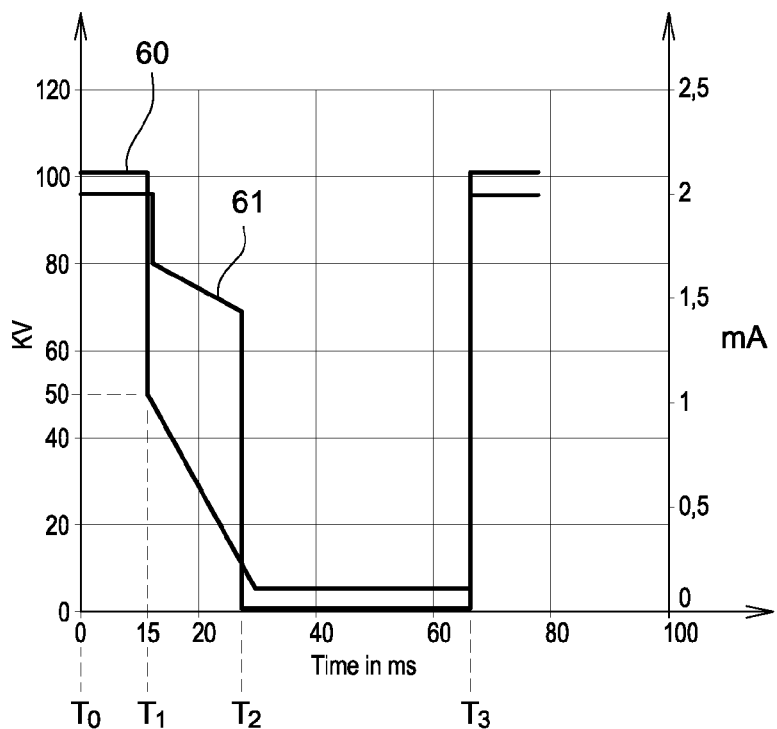
Fig. 4
Fig. 5

X-RAY APPARATUS

FIELD OF THE INVENTION

The field of the invention relates to x-ray apparatus generally, and more particularly to medical imaging and medical diagnostic apparatuses. These diagnostic apparatuses are X-ray image acquisition apparatuses.

An embodiment of an X-ray apparatus of the invention has a general selector switch aimed at discharging high voltage between a high-voltage power supply source and electrodes of the X-ray apparatus.

However, embodiments of the invention can be applied to any other field in which a high voltage is discharged.

DESCRIPTION OF THE PRIOR ART

Today, X-ray apparatuses are used to obtain images, or even sequences of images, of an organ located in a living being, especially a human being. The X-ray apparatus has an X-ray tube generally contained in a metal sheath. This metal sheath firstly provides electrical, thermal and mechanical protection for the X-ray tube. Secondly, it protects operators from electrical shocks and X-rays.

The X-ray apparatus has a high-voltage generator supplying the X-ray tube with energy. This high-voltage generator is contained in an enclosure generally situated at & certain distance from the X-ray tube. In operating mode, one or more high-insulation cables convey the high voltage up to the sheath containing the X-ray tube.

However, during a radiology examination, the tube is supplied with undesired energy that is not delivered by the generator. This phenomenon, observed in present-day X-ray apparatuses, is shown in FIG. 1. In FIG. 1, two distinct curves depict the progress in time of the high voltage powering the tube and the intensity of the X-rays given by the tube during a radiology examination.

In FIG. 1, the x-axis represents the time in milliseconds. The y-axis situated to the left of the figure represents the high voltage in kilovolts. The y-axis situated to the right represents the intensity of the X-rays in milliamperes given by the tube. The curve 2 represents the progress in time of the high voltage powering the tube during a radiology examination. The curve 3 represents the progress in time of the intensity of the X-rays received by the patient during a radiology examination.

At the step T0, the high-voltage generator gives the tube a pulse of about 100 kilovolts. This pulse, having a 15-millisecond width in the example, lasts up to the step T1. Between the steps T0 and T1, the tube converts the energy given by the generator into X-ray intensity as is shown by the curve 3.

The step T1 marks the end of the pulse given by the generator and should mark the end of the X-radiation given by the tube. However, as can be seen in the curve 2, the tube continues to be powered with high voltage. The residual energy powering the tube lasts from the step T1 up to the step T2. This residual energy, which is not given by the generator decreases with time. The curve 2 represents this residual energy by a slope 4 decreasing between T1 and T2.

This decreasing slope 4 of the curve 2 is due to a restitution of the residual energy stored during the pulse of the generator and to low charge in the tube. This residual energy is stored firstly in the output capacitance of the high-voltage generator and secondly in the capacitances of the high-voltage cables. The power supply of the tube lasts after the pulse of the generator and until the energy stored in the capacitances is depleted. The time during which the tube is powered by the stored energy then depends on the size of the storage of the output capacitance of the generator and the length of the shielded cables.

The powering of the tube along the decreasing slope 4 subjects the patient to undesired radiation. It also produces artifacts in the radiography image when the reading on the screen is slow, as in the case of a flat screen. In the example explained, the radiation received by the patient in a radiology examination lasts about 45 milliseconds instead of 15 milliseconds, thus unnecessarily extending the time of exposure of the patient.

At present, for a standard diagnostic operation, a tube is powered between 50 kilovolts and 120 kilovolts. For this interval, the tube gives X-rays that are harmful to the patient when the exposure time is lengthy. Thus, the tube powered by the energy corresponding to the slope decreasing from 100 to 50 kilovolts gives X-radiation that is harmful to the patient and catastrophic for the image to be viewed.

Between the steps T2 and T3, the stored energy is depleted. This causes the high-voltage curve 2 and the X-ray intensity curve 3 to go to the zero level. At the step T3, the high-voltage generator gives another pulse.

There are several classic solutions at present to resolve the drawbacks due to the discharge of energy stored in the capacitances. In a first classic approach, the physical storage size of the output capacitance of the high-voltage generator is reduced to the greatest possible extent. Another solution consists in reducing the length of the cables by enclosing them in the generator. These two solutions taken singly or in combination reduce the drawbacks without in any way resolving them. These approaches are generally used in low-priced X-ray tubes.

Another classic solution consists of the use of a grid tube. This grid is a barrier grid or suppression grid. This grid is an electrode interposed between the cathode and anode of the tube. In an electron tube it is designed to eliminate the secondary emission from the grid.

The electron beam of the decreasing slope 4 is stopped with the electrons of the grid of the X-ray tube upon application of a negative voltage to this grid. This blocking of the electron beam eliminates the radiation produced by the residual energy. However, this option is complex and costly to implement.

Another classic approach consists in rapidly discharging the energy stored in the capacitors once the pulse is finished. There are several methods in the prior art for high-voltage discharging. In one of these methods, the high voltage is discharged by means of a laser between two electrodes. However, this discharging cannot be done for an X-ray tube, given the size and the price.

There is another method for connecting several switch components in series. These switch components have to be triggered at the same time in order to obtain optimum discharging. However, this method is complex in its implementation. The selection switching which has to be done at a precise, required instant is fairly difficult to achieve. The current approaches using these types of typology call for extremely precise selection-switching to switch all the components at the same time in order to avert possible malfunctions.

At present, all the methods used for high-voltage discharging are unachievable for an X-ray tube or are complex or difficult to implement.

SUMMARY OF THE INVENTION

Embodiments of the invention are directed to overcoming at least the problems of the prior art referenced above. To this end, embodiments of the invention provide a general high-voltage selector switch placed between the high-voltage generator and the X-ray tube. This general high-voltage selector switch is used to eliminate the residual energy stored in the capacitances of the high-voltage cables and in the output capacitance of the generator.

The general selector switch has several series-connected switch cells. Each switch cell has a high-voltage switch component. In a preferred example, this switch component is a sidac component parallel-connected to a switch such as a thyristor. The high voltage to be discharged is distributed over a set of primary capacitors, each connected to one of the switch cells. In order that each switch cell may have the same voltage, an embodiment of the invention provides for a voltage regulation balancing circuit. The number of switch cells is determined as a function of the voltage to be discharged.

An embodiment of the invention has an external control circuit used to trigger the selection switching of the switch component of a first switch cell prompting the discharge of the primary capacitor connected to this cell. Once the voltage of the first switch cell drops, an internal control circuit of the next switch cell is triggered, so as to prompt the switching of the switch component of said cell. This selection switching prompts the discharge of the primary capacitor connected to said cell. This process continues accordingly until the last cell.

An embodiment of the invention thus implements a chain reaction of the selection switch operations for the switch components of the cells. This chain reaction is intended to implement a cascaded discharging of the high voltage distributed among the primary capacitors. The control of the chain reaction of the selector switch operations for the switch components of the general switch is very simple. A mere transmission of a simple 15-volt signal to a first switching cell can start this control.

An embodiment of the invention eliminates the radiation given by the residual high-voltage between 100 kilovolts and 50 kilovolts which adversely affects both the patient and the radiography image to be viewed.

The solution used by an embodiment of the invention to discharge the high voltage in an X-ray tube is simple as compared with those existing in the prior art.

For gridless tubes, the use of an embodiment of the general switch eliminates undesired radiation directed towards the patient without increasing the cost of such tubes.

For gridded tubes, an embodiment of the general switch can replace the grid and the grid control, significantly reducing the volume in a sector close to the patient. The elimination of the grid and of the grid control can give better angulations to the tube. Furthermore, the cost of an embodiment of the general switch is far lower than the cost of the grid control.

An embodiment of the general switch can be mounted during manufacture, directly on a tube already in use or else it can be integrated into the X-ray generator within the transformer unit comprising the rectifier circuit and the filtering circuit. The assembly requires neither adjustments nor modification of the electrical circuits already present in the X-ray device. Only a few wires need to be added to the existing circuit. An embodiment of the general switch does not alter the original electrical circuit. If the general switch were to go out of order, the use of the X-ray apparatus would not be adversely affected because, in this case, the circuit would be shorted. However, the drawbacks of the prior art would no longer be resolved. An embodiment of the general switch is made up of common, low-cost components so that it is easy and inexpensive to manufacture.

In an embodiment, an x-ray apparatus may comprise: an X-ray tube and an electrical power supply. The electrical power supply may be configured to provide a high voltage. The electrical power supply may comprise a general switch configured to connect an electrode of the x-ray tube to a ground. The general switch may comprise at least two switch cells series-connected between the electrode and the ground. Each switch cell may comprise a main capacitor parallel-connected with a switch component. A first switch cell may be configured to be controlled by an external control unit, but the other switch cells may each comprise an internal control unit. Each internal control unit may be connected to a terminal common to two switch cells.

BRIEF DESCRIPTION OF THE DRAWINGS

Embodiments of the invention will be understood more clearly from the following description and the accompanying figures. These figures are given by way of an indication and in no way restrict the scope of the invention.

FIG. 4 is a detailed view of the working of two switch cells constructed in accordance with principles of the invention.

FIG. 5 comprises two curves showing the progress in time of the high voltage and the intensity of the X-rays, constructed in accordance with principles of the invention, during a radiology examination.

DETAILED DESCRIPTION OF EMBODIMENTS OF THE INVENTION

In a preferred embodiment, embodiments of the general switch may be installed in an X-ray apparatus, it being understood that this general switch can be installed in any other apparatus requiring a speedy discharge of high voltage.

Figure 1:
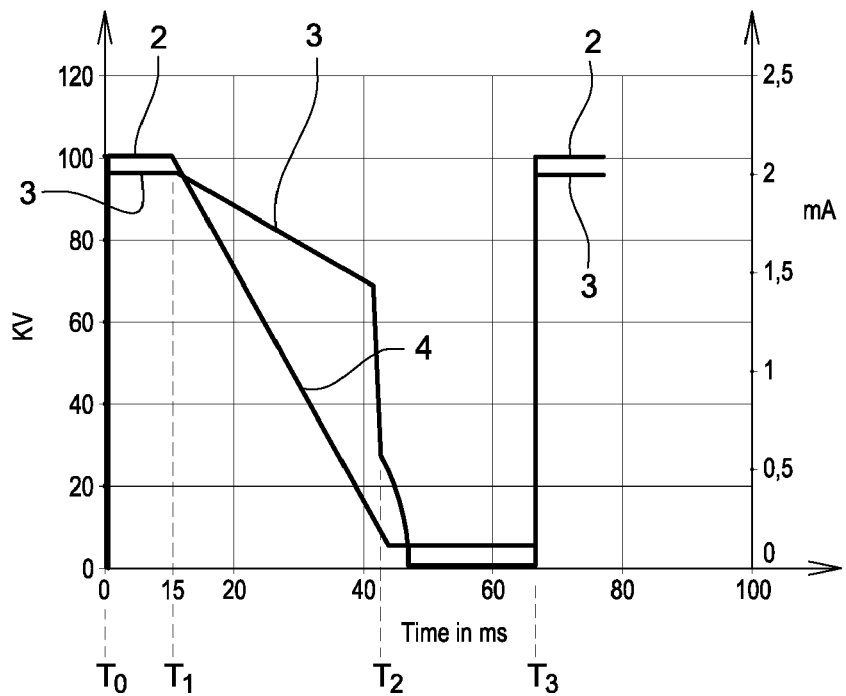
FIG. 1, already described, comprises two curves showing the progress in time of the high voltage and the intensity of the X-rays during a prior art radiology examination.
Figure 2:
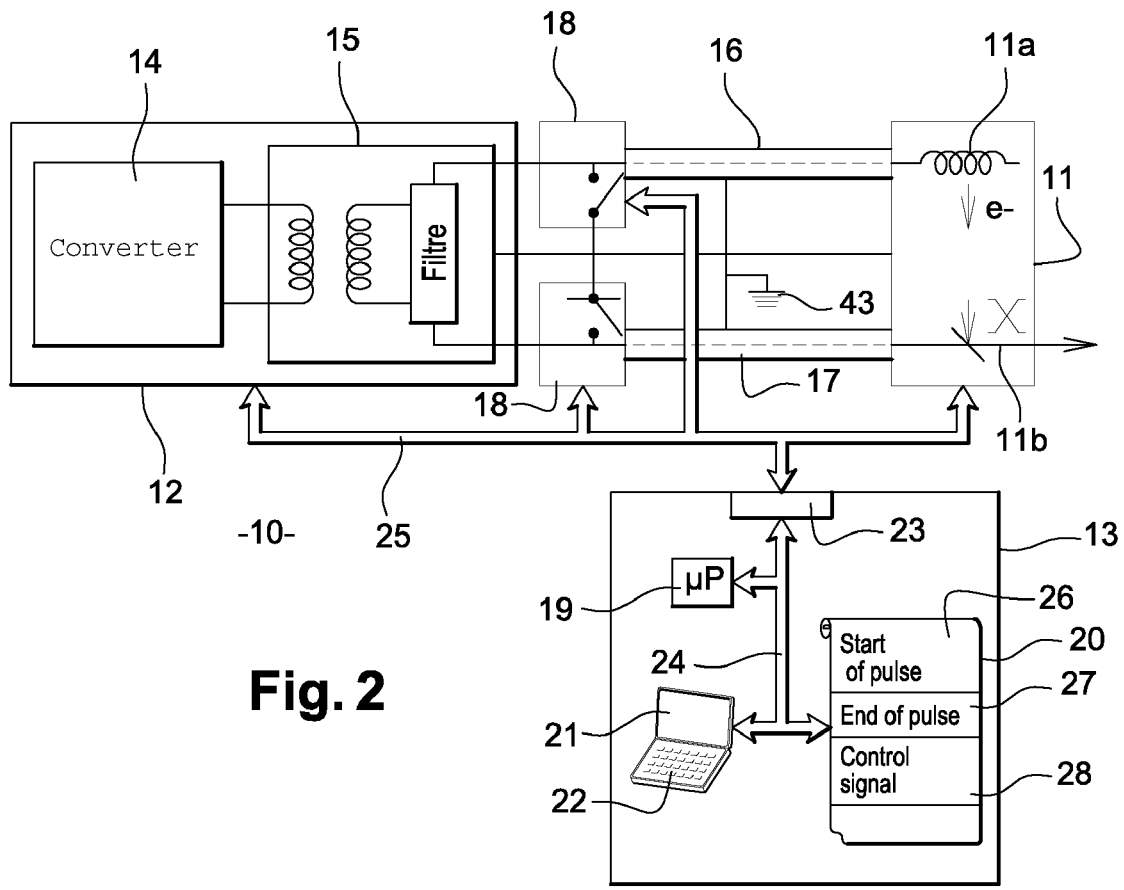
FIG. 2 shows an X-ray apparatus comprising a general high-voltage selector switch constructed in accordance with principles of the invention.

FIG. 2 provides a schematic view in one example of an X-ray apparatus comprising a general high-voltage selector switch constructed in accordance with the principles of the invention. The X-ray apparatus 10 has an X-ray tube 11, a high-voltage generator 12 and an external control unit 13. These elements may be physically isolated, as in most fixed radiography installations. They may be brought together in compact units that are configured to be moved to the patient's bedside.

The tube 11 has a cathode electrode 11a responsible for emitting electrons and an anode electrode 11b, which is a source of X-ray production. The tube 11 is surrounded by a protective jacket such as a sheath to give the tube electrical, thermal and mechanical protection while, at the same time, protecting operators against leakage radiation.

The generator 12 produces a current with a voltage adjustable between 40 kilovolts and 150 kilovolts. The generator 12 has a converter 14. This converter 14 may be a limiter or rectifier depending on whether the high-voltage source of the generator is an AC source or a DC source. It produces DC (i.e. one-directional) voltages or currents out of the AC voltage or current source. The converter generally consists of diodes assembled so that the current always flows in the same sense.

The generator 12 has a transformer 15. The transformer 15 converts a 220 V or 380 V current given by the converter 14 into a current with a high voltage of 50 to 120 kilovolts. The transformer 15 supplies the shielded cables 16 and 17 with high voltage. The sheathed cable 16 is connected to the cathode 11a and the sheathed cable 17 is connected to the anode 11b.

The tube does not consume a great deal of energy. The energy stored in the cables is sufficient to continue powering it. To eliminate the energy stored in the output capacitance of the generator (not shown) and in the sheathed cables 16 and 17, the generator 12 has a general switch 18. This general switch 18 is designed to connect the cathode 11a and/or the anode 11b to ground 43. The general switch 18 discharges the residual high voltage contained in the capacitances to ground 43. It may be placed in the two sheathed cables 16 and 17 or preferably in the positive cable 17 connected to the anode. It may also be placed in the X-ray tube 11 or any other appropriate place in the X-ray apparatus. Because of problems related to space requirement, the general switch 18 is preferably placed in the generator 12. The general switch 18 is shown in greater detail in FIGS. 3 and 4.

The external control unit 13 is often made in integrated-circuit form. In one example, this external control unit 13 has a microprocessor 19, a program memory 20, a display screen 21 provided with a keyboard 22 and an input-output interface 23. The microprocessor 19, the program memory 20, the display screen 21 and the input-output interface 23 are interconnected by an internal bus 24.

The external control unit 13 communicates with the different elements of the X-ray apparatus 10 through a communications bus 25.

In practice, when an action is attributed to a device, this action is performed by a microprocessor of the general switch controlled by instruction codes recorded in a program memory of the device. The external control unit 13 is such a device.

The program memory 20 is divided into several zones, each zone corresponding to instruction codes to fulfill one function of the device. Depending on the embodiments of the invention, the memory 20 has a zone 26 comprising instruction codes to detect a start of a pulse given by the generator 12. The memory 13 has a zone 27 comprising instruction codes to determine an end of a pulse on the predefined pulse width. The memory 13 has a zone 28 comprising instruction codes to transmit a control signal, as soon as the pulse has ended, to an embodiment of the general selector switch 18. This control signal prompts the triggering of the discharge of the energy stored in the different capacitances of the X-ray apparatus. The control signal triggers the switching of the switch component of the first cell.

Figure 3:
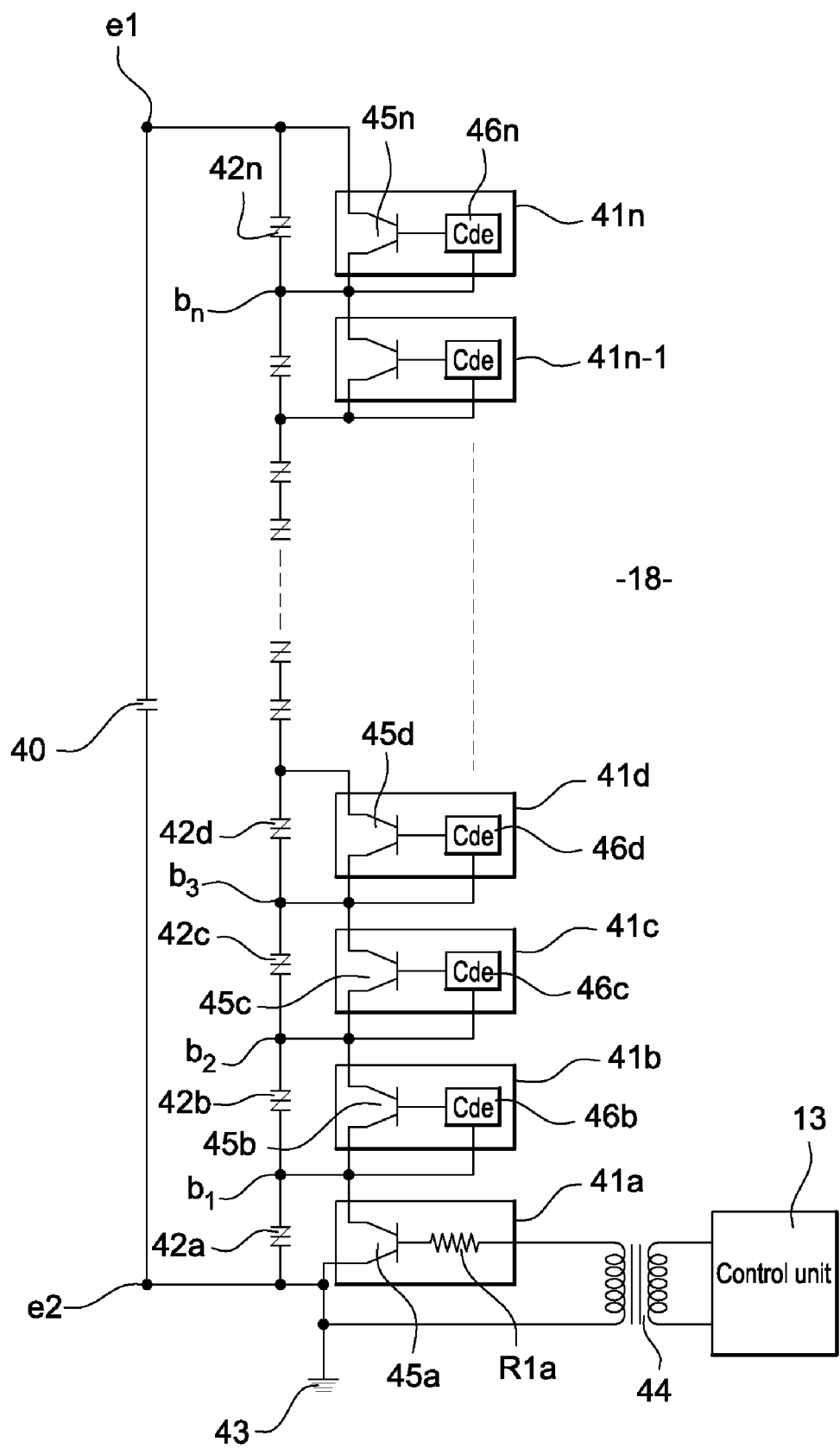
FIG. 3 is a view, in one embodiment of the invention, of several series-connected switch cells used to discharge the high voltage from a high-voltage source.

FIG. 3 is a schematic view of an embodiment of the general high-voltage selection switch 18. The general switch 18 is designed to discharge a high-voltage source 40 powering the tube well after the generator has stopped emitting a pulse. This high-voltage source 40 is the energy that has collected in the different capacitances of the X-ray apparatus.

The high-voltage source 40 is discharged through several switching cells 41a to 41n series-connected with the terminals e1 and e2 of the source 40. These cells 41a to 41n are preferably identical in an embodiment of the invention. In this case, the cells have the same electronic components. The number of switch cells 41a to 41n is determined as a function of the high voltage delivered by the source 40 to be discharged divided by a breakdown voltage of the cell. The breakdown voltage is the maximum voltage that can be supported by a cell. In a preferred embodiment, a number of cells that is more than sufficient must be defined in order to cope with possible failure in the operation of the cells. This number of cells, which is more than sufficient must be capable in its totality of supporting more than the high voltage to be discharged.

Each switch cell 41a to 41n respectively comprises a main capacitor 42a to 42n. Each switch cell 41a to 41n respectively comprises a switch component 45a to 45n. In a preferred example, the switch components are identical.

Each main capacitor 42a to 42n is parallel-connected respectively with the switch component 45a to 45n of the cells. The fact of setting up a series connection of several cells 41a to the terminals e1 and e2 of the source 40 divides the high voltage given by the source 40 into several small sets of energy stored in the primary capacitors 42a to 42n, the storage capacity of each primary capacitor 42a to 42n being defined respectively as a function of the breakdown voltage of each switch cell 41a to 41n. Since the cells 41a to 41n are identical, the storage capacity of each primary capacitor 42a to 42n is identical.

In one embodiment, the switch cells may comprise different electronic components depending on embodiments of the invention. They may also have breakdown voltages different from one another. In this case, the storage capacity of each capacitor is defined as a function of the breakdown of the switch cell to which it is connected.

The high voltage of the source 40 is discharged by successively controlled operations for switching over to switch components of each switch cell 41a to 41n. The selection switching command for each switch cell 41a to 41n leads to the discharging of the energy stored in the corresponding primary capacitor 41a to 42n. The cells 41a to 41n respectively discharge the energy stored in the primary capacitors 42a to 42n to ground 43.

The main switch 18 is in contact with the external control unit 13 by means of a switch cell 41a referenced herein as being the first switch cell of said general switch to be switched. This first switch cell 41 is connected to the ground 43. It is considered to be the low part connected to the ground of said device. In other variants, other switch cells of the general switch may be chosen as being the first to be switched as a function of the different embodiments of the invention.

The first switch cell 41a is connected to the external control unit 13 via a transformer 44. The external control unit 13 transmits the control signal to the transformer 44. The transformer 44 gives the first switch cell 41a a control voltage for triggering the discharge via a resistor R1a, upon reception of the control signal. In a preferred example, this triggering voltage is equal to 15 volts.

In a preferred embodiment, the switch component 45a is a sidac component parallel-connected with a thyristor. The switch component 45a may be replaced by any other type of existing switch component enabling an embodiment of the invention to be applied.

The triggering of the first switch cell 41a is carried out by the external circuit, which in this case is the external control unit 13. All the other switch cells 41b to 41n respectively comprise an internal control unit 46b to 46n. The internal control unit 46b to 46n is respectively connected to a terminal p1a to p1n common to two series-connected switch cells. The internal control unit 46b to 46n enables the triggering of the discharge of the corresponding switch cell. The working of the internal control unit 46b is shown in detail in FIG. 4.

During the working of the general switch 18, only the thyristors of the switch components of the switch cells situated before a transition cell are triggered when these switch components are switched. The transition cell is the cell by which the voltage of the cells is greater than or equal to a predefined transition voltage.

The transition voltage is greater than the powering-on voltage for sidac components. This transition voltage marks the transition point between the switching of the thyristor switches and the sidac switches of a switch component of an embodiment of the invention. The transition voltage depends on the voltage to be switched, the precision of the powering-on voltage for the sidac switches and the balancing of the voltage between the cells.

For all the other cells situated after this transition cell, only the sidac switches are triggered during the switching of the switch components of these cells.

As soon as the external control unit 13 dictates the switching of the switch component 45a of the first switch cell 41a, the primary capacitor 42a connected to the terminals of the switch cell is discharged. This switching of the switch component 45a of the first switch cell 41a causes a voltage drop across the terminals of this switch cell 41a. This voltage drop triggers the internal control unit 46b of the last switch cell 41b by the discharging of the capacitor C1 of FIG. 4 on the thyristor of the switch component 45b.

As soon as the internal control unit 46b imposes the selection switching of the switch component 45b of the second switch cell 41b, the primary capacitor 42b connected to the terminals of the switch cell is discharged. The voltage drop across the terminals of the second switch cell 41b leads to the triggering of the control unit 46c of the third switch cell 41c and the discharging of the primary capacitor 42c connected to the terminals of the cell. The triggering of the cells one after the other causes the primary capacitors 42a to 42n to get discharged one after the other.

Thus, the triggering of the first switch cell automatically prompts that of the second switch cell which automatically prompts that of the third switch cell and so on and so forth. At a given point in time, the remaining cells, which have not yet been triggered will support a voltage greater then the powering-on voltage for the sidac switch components. The voltage supported by the cells is greater than the transition voltage. In order to overcome any possible destruction of cells, all the sidacs of the switch components that are not switched are triggered at the same time discharging the high voltage of the corresponding main capacitors. The conduction path will then be set up by certain sidac switches close to the high-voltage connection of the switch components 45n−1, and the thyristor switches close to the low-voltage connection of the switch components 45a, 45b . . . .

In one embodiment, the switch components situated towards the ground may comprise only thyristors. And the switch components situated after the transition point may comprise only sidacs.

In an embodiment of the general switch, it is not necessary to have an external control unit on each switch cell. A single control on one of the switch cells is sufficient. And it is the triggering of this switch cell that will call the triggering of the next switch cell and so on and so forth, giving rise to a chain reaction. With an embodiment of the general switch, the switching of all the cells at the precise switching instant is no longer required, thus eliminating the selection switching constraints of the prior art.

In an embodiment of the general switch, the switch components 45a to 45n of the cells 41a to 41n are actuated one after the other as and when the voltage in said cells drops. The routing of the call is done gradually from one switch component to another. All the switch components thus actuated are kept in working position until the end of the discharging. At the end of the discharging, all the switches, namely the thyristor (or its equivalent) and the sidac, are off and ready for a new working cycle.

FIG. 4 shows an example of operation of three switch cells 41a to 41c of an embodiment of the invention. It is known that the rest of the cells work in the same way.

In one example, the voltage to be discharged is equal to 60 kilovolts. To discharge this voltage, several cells are series-connected to the terminals of the source of the 60 kilo V. Should each switch cell have a breakdown voltage of 1 kilovolt, then the number of cells needed to discharge this voltage of 60 kilo V is a minimum of 60. In one example, the number of cells to be series-connected is equal to 100.

In order to cope with a possible malfunctioning of cells in the general switch 18, a sufficient number of cells, preferably a number preferably greater than the result obtained, is installed. In one example, the number of cells to be series-connected is equal to 100. The primary capacitors 42a and 42b each have a storage capacity defined on the basis of one kilovolt.

In order that each switch cell may have the same breakdown voltage, an embodiment of the invention also implements a balancing circuit 47a to 47n respectively connected to the terminals of the cells 41a to 41n. The balancing circuits 47a to 47n are used to obtain almost constant voltage at the terminals of the cells 41a to 41n. The balancing circuits 47a to 47n are voltage regulators. They limit voltage differences between the cells 41a to 41n and ensure equal distribution of the voltages of the cells. The balancing circuits 47a to 47n are formed by a set of resistors respectively connected in parallel to the terminals of each main capacitor 42a to 42n.

The balancing circuit 47a has a current stabilising resistor 49a. The other circuits 47b to 47n are identical. The circuits 47b to 47n respectively comprise a resistor 48b to 48n connected between a terminal p1b to p1n common to two switch cells and a midpoint b1 to bn between two main capacitors 42a to 42n. The circuits 47b to 47n also have a voltage-stabilising resistor 49b to 49n. The circuit 47a to 47n of the example of FIG. 4 may be replaced by other types of existing voltage regulation circuits.

The switch cell 41a has a switch component 45a connected to a low-impedance resistor R1a. In the example of FIG. 4, the switch component 45a has a sidac component 50a parallel-connected to a switch 50'a. In the preferred example, this switch 50'a is a thyristor.

As can be seen in FIG. 4, the sidac component 58 is a four-layer two-terminal component. It has an internal resistor with a value of some hundreds of kiloohms, when the voltage applied to its terminals is lower then the voltage for triggering the sidac component which is equal to about 200 V for a given model. Once the voltage applied to the terminals of the sidac component 58 exceeds the triggering voltage, the internal resistor of the sidac component 50a becomes very low, with a value of about some ohms. In this case, the sidac component 50a behaves like a thyristor. The use of a component such as the sidac component is also designed to provide protection for the switch cell when the voltage applied to its terminals is greater then the breakdown voltage.

The sidac components 50b to 50n have the same characteristics as the sidac component 50a.

The general switch has a secondary capacitor C1 connected between two midpoints p2a and p2b of two series-connected switch cells. In the example of FIG. 4, the resistor R1 has an impedance of 100 ohms. The resistor R1a is connected between the thyristor 50'a and the transformer 44.

The switch cell 41b has a switch component 45b connected to an internal control unit 46b. The switch component 45b has a sidac component 50*b* parallel-connected to a thyristor 50'*b*. The general switch has a secondary capacitor C2 connected between two midpoints p2*b* and p2*c* of the two series-connected switch cells 41*a* and 41*b*.

The internal control unit 46*b* has the following connected in series in a control connection: a high-impedance resistor R2*b* and a low-impedance resistor R1*b* connected by a midpoint P3*b* to the high-impedance resistor R2*b*. In the example of FIG. 4, the resistor R2*b* has an impedance of 100 kiloohms and the resistor R1*b* has an impedance of 100 ohms. The high-impedance resistor R2*b* is connected to the midpoint b1 between two main capacitors 42*a* and 42*b*.

The switch cell 41*c* has a switch component 45*c* connected to an internal control unit 46*c*. The switch component 45*c* has a sidac component 50*c* parallel-connected to a thyristor 50'*c*. The general switch has a secondary capacitor C3 (not shown) connected between two midpoints p2*c* and p2*d* of two series-connected switch cells 41*b* and 41*c*.

The internal control unit 46*c* has the following connected in series in a control connection: a high-impedance resistor R2*c* and a low-impedance resistor R1*c* connected by a midpoint P3*c* to the high-impedance resistor R2*c*. In the example of FIG. 4, the resistor R2*c* has an impedance of 100 kiloohms and the resistor R1*c* has an impedance of 100 ohms. The high-impedance resistor R2*c* is connected to the midpoint b2 between two main capacitors 42*b* and 42*c*.

As in the example of FIG. 4, the circuits connected to the first switch cell by which the switching is begun comprise components and, at times, connections different from those of the other cells. In one variant, the circuits may be identical to those of the other cells.

The secondary capacitor C1 is charged in order to trigger the switch component 45*b* of the second switch cell 41*b*. The secondary capacitor C1 is charged during the step of balancing the voltage of the first switch cell 41*a*. The secondary capacitor C2 is charged in order to trigger the switch component 45*c* of the third switch cell 41*c*. The secondary capacitor C2 is charged during the step of balancing the voltage of the first switch cell 41*b*. The process is pursued accordingly for the secondary capacitors C3 to Cn of the following n cells.

The first switch cell 41*a* receives the control signal from the external control unit via the transformer on the resistor R1*a*. The switch component 45*a* is triggered. In this case, only the thyristor 50'*a* is triggered. The sidac 50*a* is not triggered because its conduction voltage is not reached. The triggering of the thyristor 50'*a* prompts a rapid drop in the primary capacitor 42*a*. The secondary capacitor C1 remains charged when the voltage of the first switch cell 41*a* drops. The current passes through the thyristor 50'*a* which has been triggered and through the sidacs 50*b* to 50*n* which have not yet been triggered.

The point P1*b* becomes equal to zero volts. Since the resistor R2 has very high impedance, the voltage at the points P2*b* and P3*b* remains equal to about 1 kilovolt. The resistor R3, being of low value, prompts the discharging of the secondary capacitor C1. The discharging of the secondary capacitor C1 triggers the switch component 45*b*. In this case, the thyristor 50'*b* is triggered. For the same reasons as in the case of the sidac 50*a*, the sidac 50*b* is not triggered. The triggering of the thyristor 50'*b* leads to a swift discharging of the primary capacitor 42*b*. The current flows through the thyristors 50'*a* and 50'*b* which have got triggered and through the sidacs 50*c* to 50*n* which have not yet got triggered.

The point P1*c* becomes equal to zero volts. Since the resistor R4 has very high impedance, the voltage at the points P2*c* and P3*c* remains equal to about 1 kilovolt. The resistor R5, being of low value, prompts the discharging of the secondary capacitor C2. The discharging of the secondary capacitor C2 triggers the switch component 45*c* of the third switch cell 41*c*. In this case, the thyristor 50'*c* is triggered. For the same reasons as in the case of the sidac 50*a*, the sidac 50*c* is not triggered. The triggering of the thyristor 50'*c* leads to a swift discharging of the primary capacitor 42*c*.

Thus, embodiments of the invention, may obtain a cascade of discharging of the high voltage through the primary capacitors connected to the cells.

Thus, once the discharging of the first switch cell is launched, the second switch cell will collapse and then the third and so on until the 41st cell, the 41st cell being in this case the transition cell between the conduction of the thyristors and of the sidac components.

At the 41st cell, the voltage sustained by the 59 remaining cells will be greater than the conduction voltage of the sidac, and then all the sidac components of the switch components of the remaining cells will get triggered at the same time in discharging the remaining high voltage. In this example, the conduction path is taken by the thyristors of the switch components from the first cell to the 41st cell and by the sidac components of the switch components from the 42nd cell to the 100th cell. Thus, in one embodiment of the invention, the switch components from the $1^{st}$ cell to the $41^{st}$ cell may comprise only thyristors and the switch components from the 42nd cell to the 100th cell may comprise only sidac components.

When the primary capacitors 42*a* to 42*n* are discharged, the switch components of all the cells return to the previous step, i.e. in powering off the voltage with high impedance.

The total switching time lasts about 40 to 50 microseconds. This is more than enough for the magnitude of the pulse width of present-day examination modes, given that the pulse width is around 50 milliseconds.

Other circuits may be defined in order to obtain this cascade of discharging, using thyristors, transistors or other switch components. An embodiment of the general selection switch 18 may be applied to all types of topologies requiring fast high-voltage discharging. In the structure of the general selection switch 18, the components may be replaced by corresponding components. Similarly, other components may be interposed between the components described for the circuit 18.

FIG. 5 gives a view, in a graph, of the progress in time of the high voltage powering the tube and the intensity of the X-rays given by the tube, during a radiology examination with an X-ray apparatus using the general selector switch of the intention.

The progress in time of the high-voltage powering the tube is represented by a curve 60 in the graph of FIG. 5. The curve 60 is represented in a Cartesian reference system where the x-axis corresponds to the time in milliseconds and the y-axis corresponds to the high voltage in kilovolts. The progress in time of the intensity of the X-rays given by the tube and received by the patient is represented by the curve 61 in the graph of FIG. 5. The curve 61 is represented in a Cartesian reference system where the x-axis corresponds to the time in milliseconds and the y-axis corresponds to the intensity of the X-rays in milliamperes.

At the step T0, the generator gives a 100-kilovolt pulse to the X-ray tube. The step T1 marks the end of the pulse, which lasts 15 microseconds. The control unit automatically transmits a control signal to the general selector switch at the step T1. Embodiments of the general switch discharge the energy stored in the capacitances of the X-ray device by means of a cascaded discharging operation.

At the step T2, the general selector switch 18 almost instantaneously discharges the harmful energy situated between 100 kilovolts and 50 kilovolts. From 50 kilovolts onwards, the tube may continue to be powered without this affecting the patient or the radiography image to be displayed. In one embodiment, the energy stored in the capacitances may be completely discharged at the step T1. With the invention, for one radiology examination the patient receives X-rays for a period of 15 to 25 milliseconds, given that the X-rays received during the final 10 milliseconds of the 25 milliseconds are not dangerous.

The control of an embodiment of the general switch is very simple. Just one simple 15-volt can start the chain reaction for discharging the high voltage stored in the capacitances of the X-ray apparatus.

When reading and/or interpreting this document, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

As mentioned above, the foregoing detailed description is by way of illustration and not of limitation. It is intended that embodiments of the invention should be limited only by the appended claims, or their equivalents, in which it has been endeavored to claim broadly all inherent novel.

What is claimed is:

1. An X-ray apparatus, comprising:
   an X-ray tube and
   an electrical power supply,
   the electrical power supply configured to provide a high voltage,
   wherein the electrical power supply comprises a general switch configured to connect an electrode of the x-ray tube to a ground,
   the general switch comprising at least two switch cells series-connected between the electrode and the ground,
   wherein each switch cell comprises a main capacitor parallel-connected with a switch component,
   wherein a first switch cell is configured to be controlled by an external control unit, wherein other switch cells each comprise an internal control unit, wherein
   each internal control unit is connected to a terminal common to two switch cells.

2. An apparatus according to claim 1, wherein the internal control unit comprises, in series in a control connection: a high-impedance resistor and a low-impedance resistor connected by a midpoint to the high-impedance resistor, wherein another terminal of the high-impedance resistor is connected to a midpoint between two main capacitors.

3. An apparatus according to claim 2, comprising a secondary capacitor connected between two midpoints of two series-connected switch cells.

4. An apparatus according to claim 1, further comprising a balancing circuit formed by a set of resistors parallel-connected to each main capacitor.

5. An apparatus according to claim 4, wherein a resistor of the set of resistors is connected between a terminal common to two switch cells and a midpoint between two main capacitors.

6. An apparatus according to claim 1, wherein each external control unit is connected to the first switch cell by a transformer and a resistor.

7. An apparatus according to claim 1, wherein the external control unit of the first switch cell is external to the first switch cell and comprises a microprocessor, a program memory and an input/output interface interconnected by a bus.

8. An apparatus according to claim 1, wherein the first switch cell connected to the external control unit is a first to switch over.

9. An apparatus according to claim 1, wherein a number of switch cells to be connected is at least equal to a result of a voltage of the high-voltage source divided by a breakdown voltage of each switch cell.

10. An apparatus according to claim 1, wherein a storage capacity of each main capacitor is defined as a function of a breakdown voltage of the switch cell to which it is connected.

11. An apparatus according to claim 1, wherein main capacitors of each switch cells have a same capacitance value.

12. An apparatus according to claim 1, wherein each switch component has a sidac component parallel-coupled to a thyristor.

13. An apparatus according to claim 1, wherein each of the switch components is identical.

14. An apparatus according to claim 12, wherein so long as a predefined transition voltage has not been reached, only the thyristors of the switch components are switched during the switching of said switch component.

15. An apparatus according to claim 12, wherein the sidacs of the switch components that have not yet been switched are triggered only when the voltage of the corresponding switch cells is greater than or equal to the transition voltage.

* * * * *